US011901661B2

(12) United States Patent
Kimura et al.

(10) Patent No.: US 11,901,661 B2
(45) Date of Patent: Feb. 13, 2024

(54) VEHICLE DOOR LOCK DEVICE AND METHOD OF MANUFACTURING VEHICLE DOOR LOCK DEVICE

(71) Applicant: MITSUI KINZOKU ACT CORPORATION, Kanagawa (JP)

(72) Inventors: Shuntaro Kimura, Kanagawa (JP); Takao Taga, Kanagawa (JP)

(73) Assignee: MITSUI KINZOKU ACT CORPORATION, Kanagawa (JP)

( * ) Notice: Subject to any disclaimer, the term of this patent is extended or adjusted under 35 U.S.C. 154(b) by 309 days.

(21) Appl. No.: 17/442,561

(22) PCT Filed: Sep. 6, 2019

(86) PCT No.: PCT/JP2019/035280
§ 371 (c)(1),
(2) Date: Sep. 23, 2021

(87) PCT Pub. No.: WO2020/194790
PCT Pub. Date: Oct. 1, 2020

(65) Prior Publication Data
US 2022/0123488 A1    Apr. 21, 2022

(30) Foreign Application Priority Data
Mar. 27, 2019   (JP) .................................. 2019-059813

(51) Int. Cl.
*E05B 79/02*    (2014.01)
*H01R 13/04*    (2006.01)
(Continued)

(52) U.S. Cl.
CPC ............. *H01R 13/04* (2013.01); *B60R 16/02* (2013.01); *E05B 79/02* (2013.01); *E05B 81/68* (2013.01);
(Continued)

(58) Field of Classification Search
CPC .... H01R 13/04; H01R 43/20; H01R 2201/26; B60R 16/02; E05B 79/02; E05B 81/68;
(Continued)

(56) References Cited

U.S. PATENT DOCUMENTS

| 6,190,209 | B1 * | 2/2001 | Hulsmann | H01R 13/05 |
| | | | | 439/74 |
| 2004/0245786 | A1 * | 12/2004 | Hashiba | E05B 81/14 |
| | | | | 292/216 |

(Continued)

FOREIGN PATENT DOCUMENTS

| GB | 2527645 A | 12/2015 |
| JP | H07-293081 A | 11/1995 |

(Continued)

OTHER PUBLICATIONS

Extended European Search Report issued in the corresponding European Patent Application No. 19922205.0, dated Nov. 23, 2022.

(Continued)

*Primary Examiner* — Jacob R Crum
(74) *Attorney, Agent, or Firm* — Rimon P.C.; Tomoki Tanida

(57) ABSTRACT

A vehicle door lock device includes: a housing; electrical components including internal pins; and a terminal electrically connected to the internal and including coupling portions coupling conductive portions. Further, electric circuits of the electrical components are formed when the conductive portions are disconnected by cutting off the coupling portions, the housing includes: positioning protruding portions that protrudes at a right angle with respect to installation portions; and fitting grooves that are opened in a direction parallel to a protruding direction of the positioning protruding portions, and the terminal includes: the conductive portions; positioning holes into which the positioning protruding portions are inserted; connector pins bent at a (Continued)

right angle, and are fitted into the fitting grooves; and electrical component pins bent at a right angle, and are configured to be electrically connected to the electrical components when inserted into the internal pins of the electrical components.

5 Claims, 12 Drawing Sheets

(51) Int. Cl.
    *B60R 16/02*     (2006.01)
    *E05B 81/68*     (2014.01)
    *H01R 43/20*     (2006.01)
    *H05K 5/02*     (2006.01)
    *E05B 81/06*     (2014.01)
    *E05B 83/36*     (2014.01)

(52) U.S. Cl.
    CPC ............ *H01R 43/20* (2013.01); *H05K 5/0217* (2013.01); *E05B 81/06* (2013.01); *E05B 83/36* (2013.01); *H01R 2201/26* (2013.01)

(58) Field of Classification Search
    CPC ...... E05B 81/06; E05B 83/36; E05B 17/0004; E05B 81/54; H05K 5/0217
    See application file for complete search history.

(56) References Cited

U.S. PATENT DOCUMENTS

| 2011/0254291 | A1 | 10/2011 | Rhein et al. | |
|---|---|---|---|---|
| 2015/0345184 | A1* | 12/2015 | Koch | E05B 81/54 174/520 |
| 2016/0356066 | A1* | 12/2016 | Mazal | E05B 85/02 |
| 2020/0087953 | A1* | 3/2020 | Odaka | E05B 81/40 |

FOREIGN PATENT DOCUMENTS

| JP | 10-196182 A | 7/1998 |
|---|---|---|
| JP | 4517914 B2 | 8/2010 |
| JP | 5050275 B2 | 10/2012 |
| JP | 2013-136361 A | 7/2013 |

OTHER PUBLICATIONS

International Search Report issued in corresponding International Patent Application No. PCT/JP2019/035280, dated Nov. 19, 2019, with English translation.

* cited by examiner

FIG.7
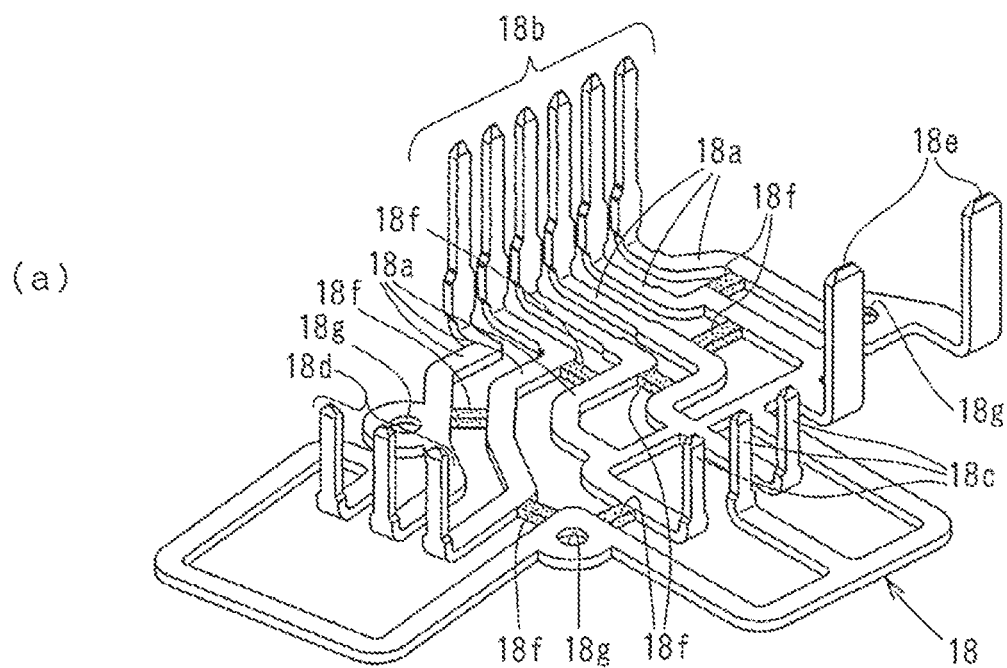
(a)
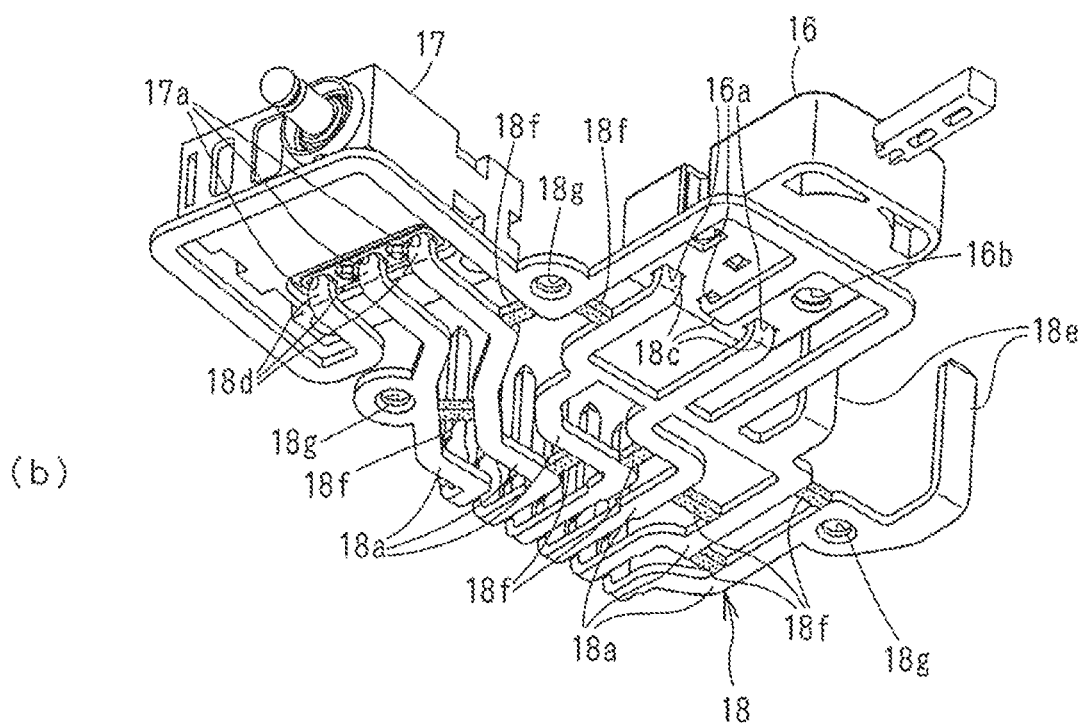
(b)

FIG.8
(a)
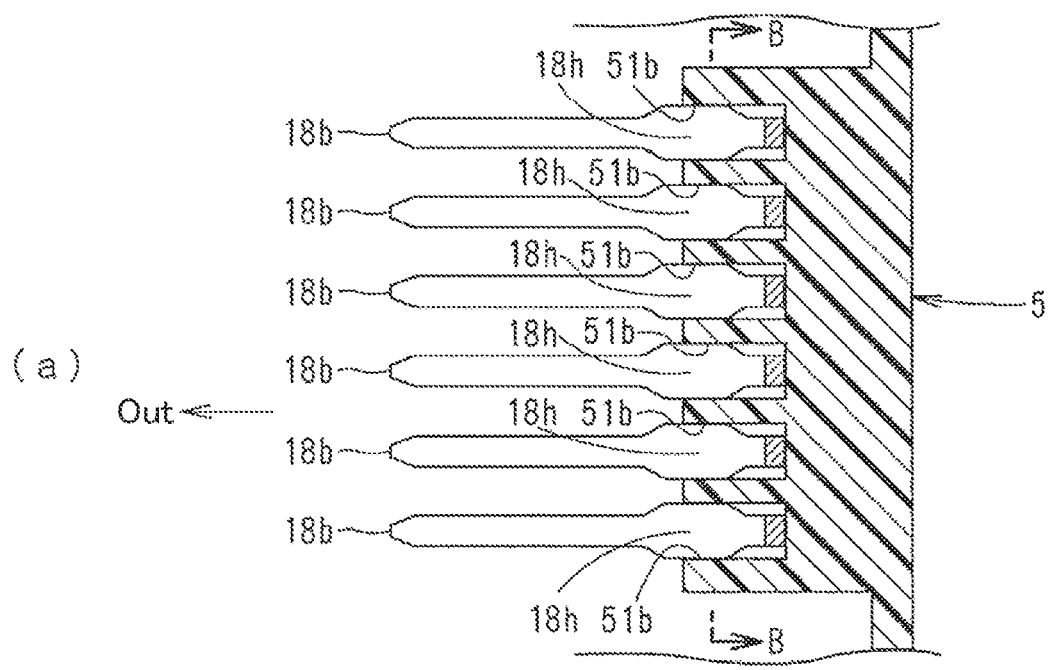
(b)
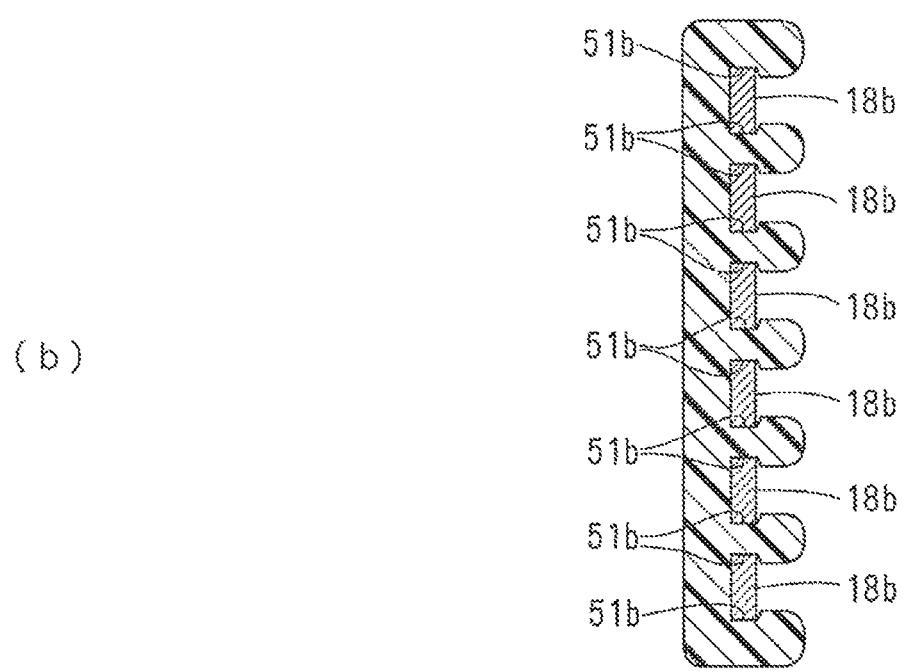

VEHICLE DOOR LOCK DEVICE AND METHOD OF MANUFACTURING VEHICLE DOOR LOCK DEVICE

CROSS-REFERENCE OF RELATED APPLICATIONS

This application is the U.S. National Phase under 35 U.S.C. § 371 of International Patent Application No. PCT/JP2019/035280, filed on Sep. 6, 2019, which in turn claims the benefit of Japanese Application No. 2019-059813, filed on Mar. 27, 2019, the entire disclosures of which Applications are incorporated by reference herein.

FIELD

The present invention relates to a vehicle door lock device that includes conductive terminals electrically connected to electrical components stored in a housing and a method of manufacturing vehicle door lock device.

BACKGROUND

Patent Literature 1 describes an invention of a vehicle door lock device including a housing (casing), electrical components stored in the housing, and conductive terminals that are electrically connected to the electrical components and have coupling portions, in which electric circuits of the electrical components are formed by disconnecting the terminals coupled with each other through intermediation of the coupling portions by cutting off the coupling portions, and the housing includes regulating portions that regulate a positional deviation (shift) of the terminals with respect to the housing when the coupling portions are cut.

CITATION LIST

Patent Literature

Patent Literature 1: Japanese Patent No. 4517914
Patent Literature 2: Japanese Patent No. 5050275

SUMMARY

Technical Problem

In the invention described in Patent Literature 1, a positional deviation of the terminals with respect to the housing is regulated by the regulating portions when the coupling portions are cut. However, it cannot be said that such regulation is securely performed. When an assembling position is deviated due to a positional deviation of the terminals, for example, in a configuration in which connector pins that are electrically connected to external connectors directly are integrally formed with the terminal as described in FIG. 36 of Patent Literature 2, it is difficult to maintain the positional accuracy of the connector pins with respect to the housing. As a result, when the external connectors are to be connected to the connector pins, the connector pins are bent and the connection is incomplete, and therefore, there may be a risk of causing a state in which a motor or a switch being an electrical component is not operated normally.

In view of the above-mentioned problem, the present invention has an object to provide a vehicle door lock device, which is capable of improving assembling position accuracy of a terminal with respect to a housing by securely preventing a positional deviation of the terminal at the time of cutting off coupling portions of the terminal, and a method of manufacturing the vehicle door lock device.

Solution to Problem

According to the present invention, the above-mentioned problem is resolved as described below.

A vehicle door lock device according to a first invention, includes: a housing; electrical components that are arranged in the housing and include internal pins; and a terminal that is conductive and electrically connected to the internal pins of the electrical components, and includes coupling portions coupling conductive portions adjacent to each other. Further, electric circuits of the electrical components are formed when the conductive portions are disconnected by cutting off the coupling portions, the housing includes: positioning protruding portions that protrudes at a right angle with respect to installation portions on which the conductive portions of the terminal are installed; and fitting grooves that are opened in a direction parallel to a protruding direction of the positioning protruding portions, and the terminal includes: the plurality of conductive portions; positioning holes into which the positioning protruding portions are inserted; connector pins that are formed at one ends of the conductive portions and bent at a right angle, and are fitted into the fitting grooves; and electrical component pins that are formed at other ends of the conductive portions and bent at a right angle, and are configured to be electrically connected to the electrical components when inserted into the internal pins of the electrical components.

Preferably, the positioning holes of the terminal are provided to outermost conductive portions among the plurality of conductive portions.

Preferably, the connector pins include widening portions that are press-fitted into the fitting grooves.

A method of manufacturing a vehicle door lock device according to a second invention, the vehicle door lock device including: a housing; switches that are arranged in the housing and include internal pins; and switch terminal that is conductive and electrically connected to the internal pins of the switches, and includes coupling portions coupling conductive portions adjacent to each other; electric circuits of the switches being formed when the conductive portions are disconnected by cutting off the coupling portions, the housing including: positioning protruding portions that protrudes at a right angle with respect to installation portions on which the conductive portions of the switch terminal are installed; and fitting grooves that are opened in a direction parallel to a protruding direction of the positioning protruding portions, the switch terminal including: the plurality of conductive portions; positioning holes into which the positioning protruding portions are inserted; connector pins that are formed at one ends of the conductive portions and bent at a right angle, and are fitted into the fitting grooves; and switch pins that are formed at other ends of the conductive portions and bent at a right angle, and are configured to be electrically connected to the switches when inserted into the internal pins of the switches, the method of manufacturing a vehicle door lock device including: fitting the positioning protruding portions into the positioning holes and fitting the connector pins into the fitting grooves under a state in which the switch pins are assembled to the switches in advance; and pressing the conductive portions of the switch terminal against the installation portions by an assembling device, cutting off the coupling portions with punches of the assembling device, thereby allowing the conductive portions to form electric circuits of the switches.

Preferably, the assembling device cut off the coupling portions with the punches under a state in which terminal clamps of the assembling device press both conductive portions adjacent to each other against the installation portions.

Advantageous Effects of Invention

According to the present invention, the assembling positional accuracy of the terminal with respect to the housing can be improved, and the positional deviation of the terminal at the time of cutting off the coupling portions can be prevented securely.

Part (a) of FIG. 7 is a perspective view of the switch terminal, and part (b) of FIG. 7 is a perspective view seen from a backside of the switch terminal module.

Figure 6:
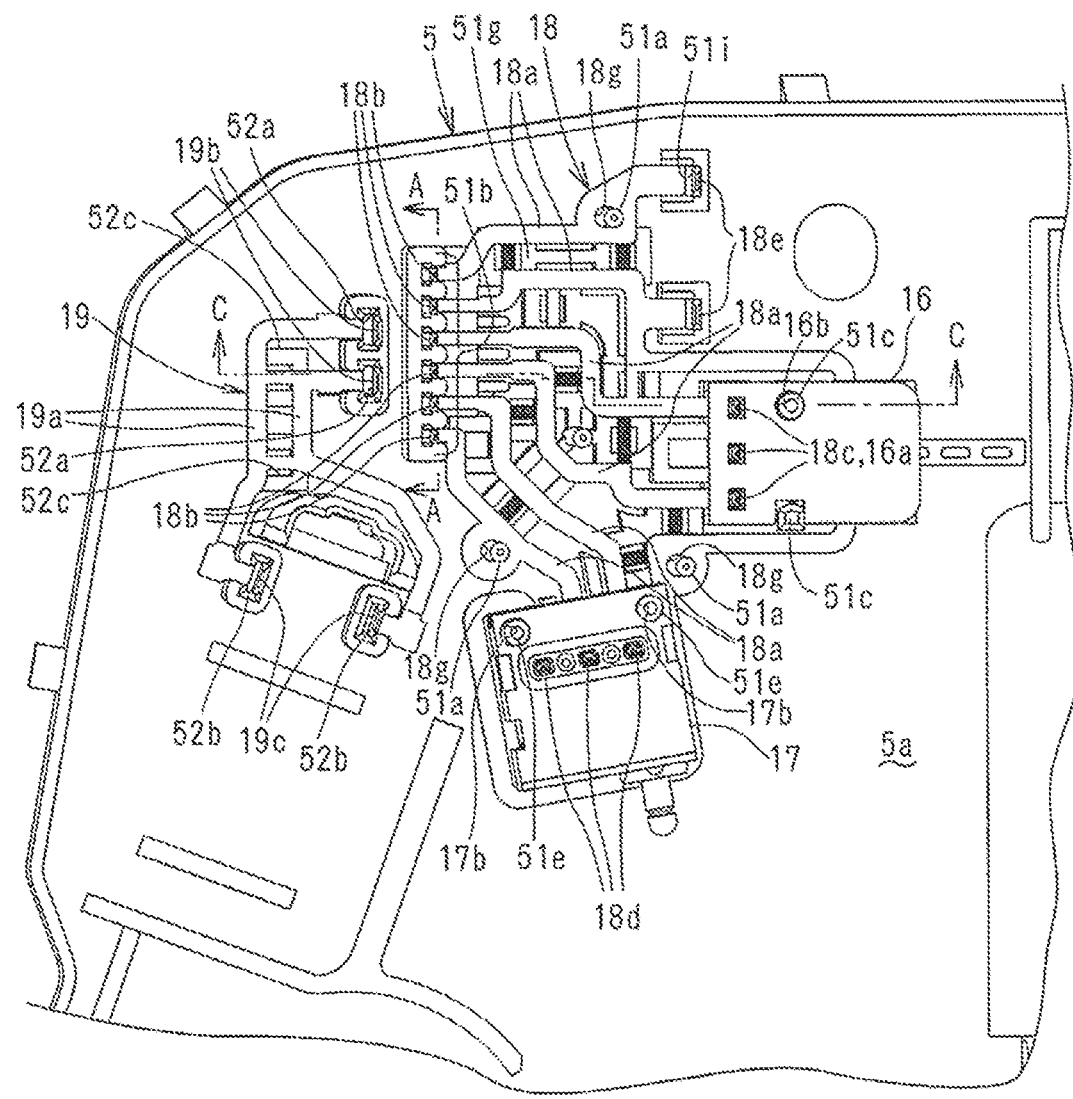
FIG. 6 is a side view of a main part in a state in which the switch terminal module and the motor terminal are assembled to the housing.

Part (a) of FIG. 8 is an enlarged sectional view taken along the line A-A in FIG. 6, and part (b) of FIG. 8 is a sectional view corresponding to the line B-B in part (a) of FIG. 8.

Figure 9:
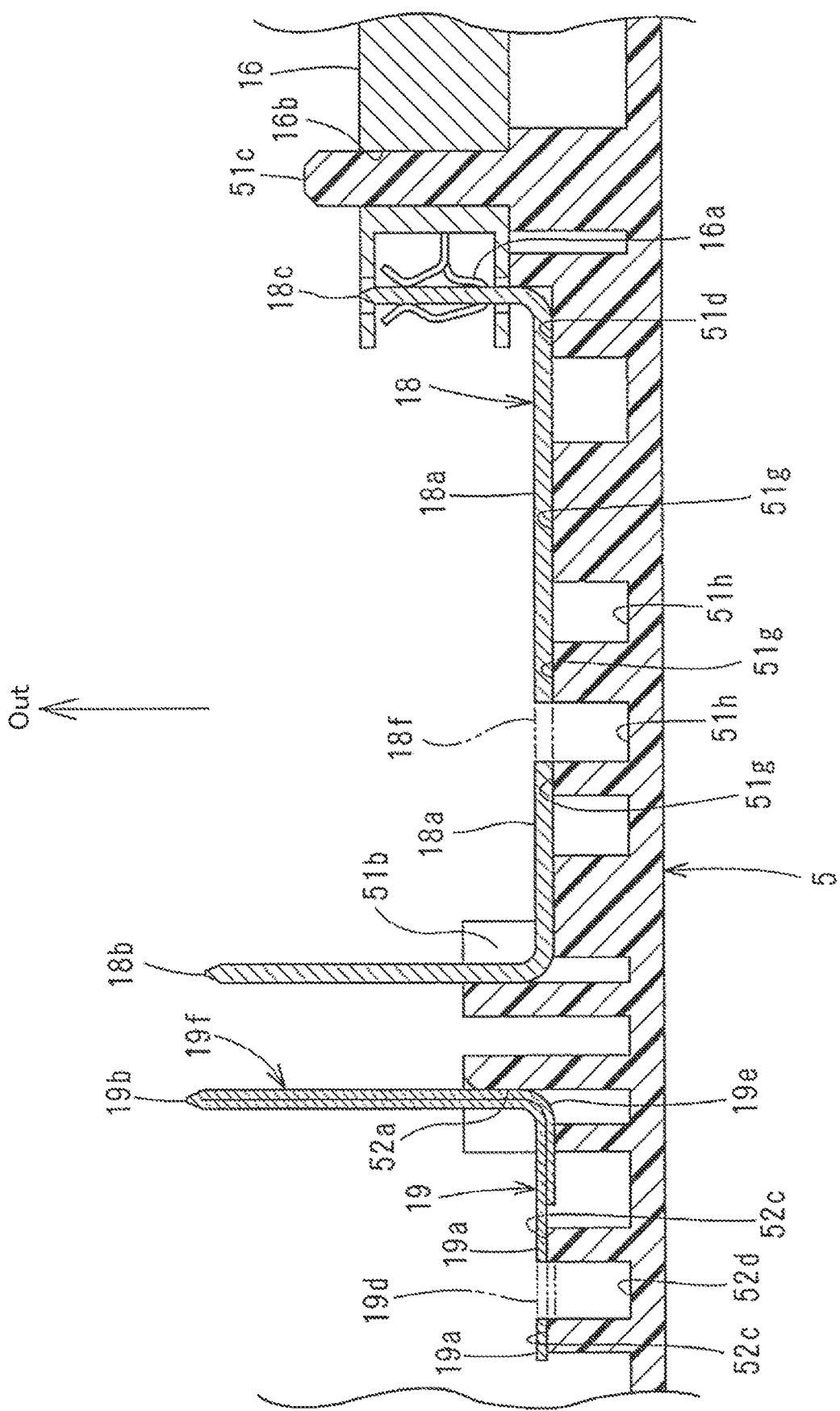

FIG. 9 is an enlarged sectional view taken along the line C-C in FIG. 6.

Figure 10:
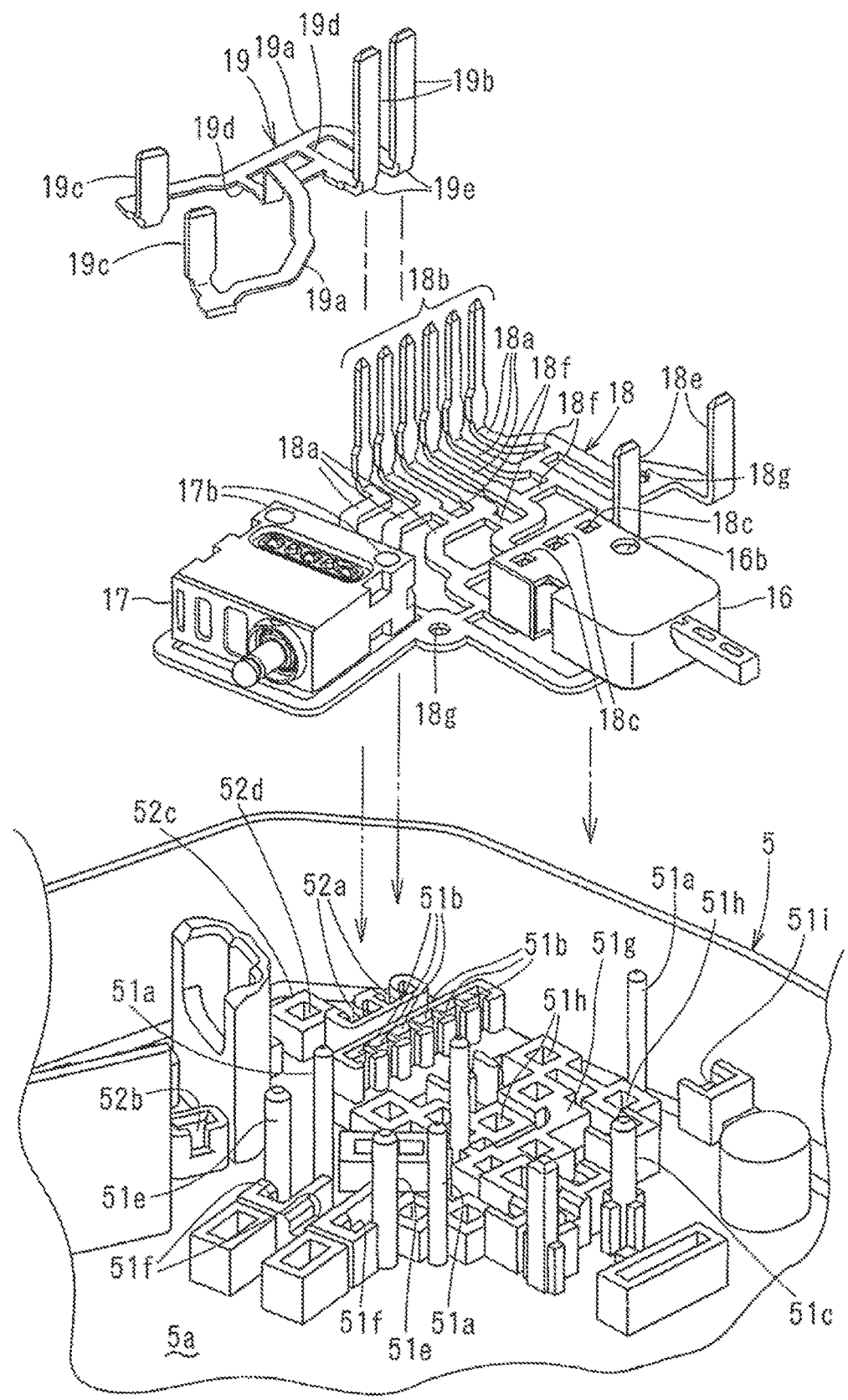

FIG. 10 is a perspective view of a main part at the time of assembling the switch terminal module and the motor terminal to the housing.

Figure 11:
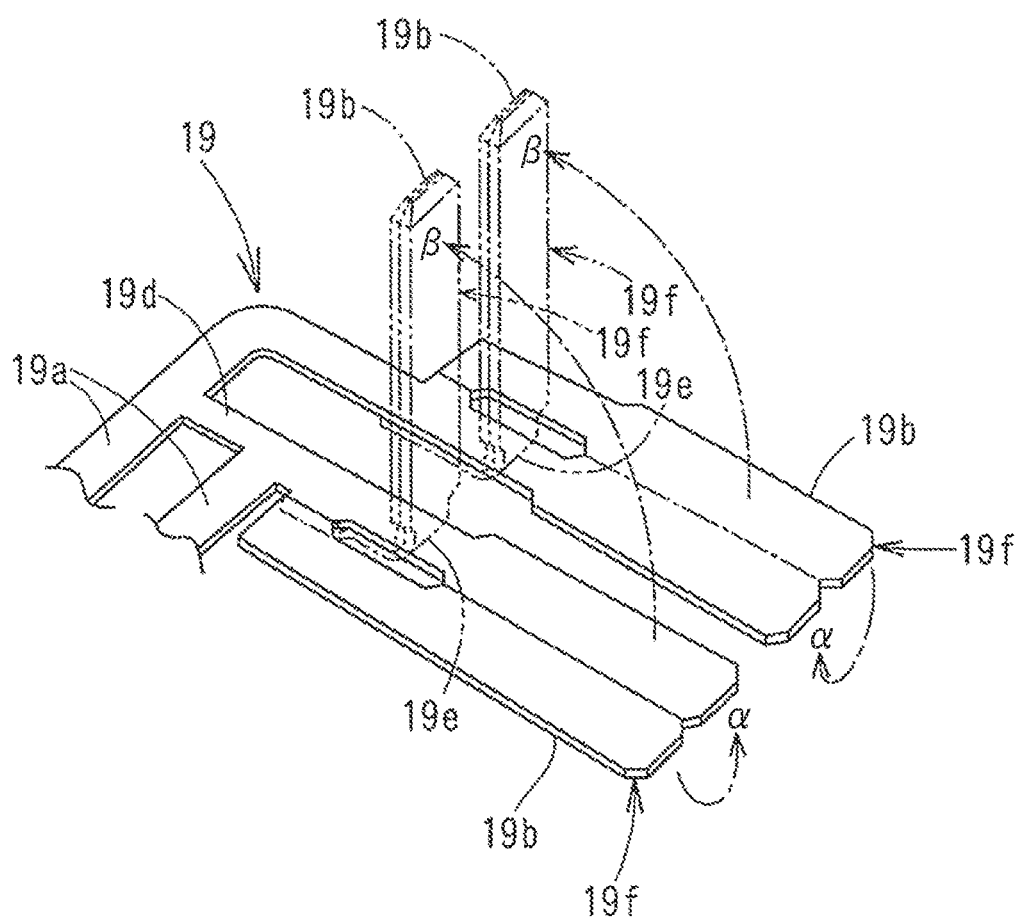

FIG. 11 is a developed perspective view of the main part of the motor terminal.

Figure 12:
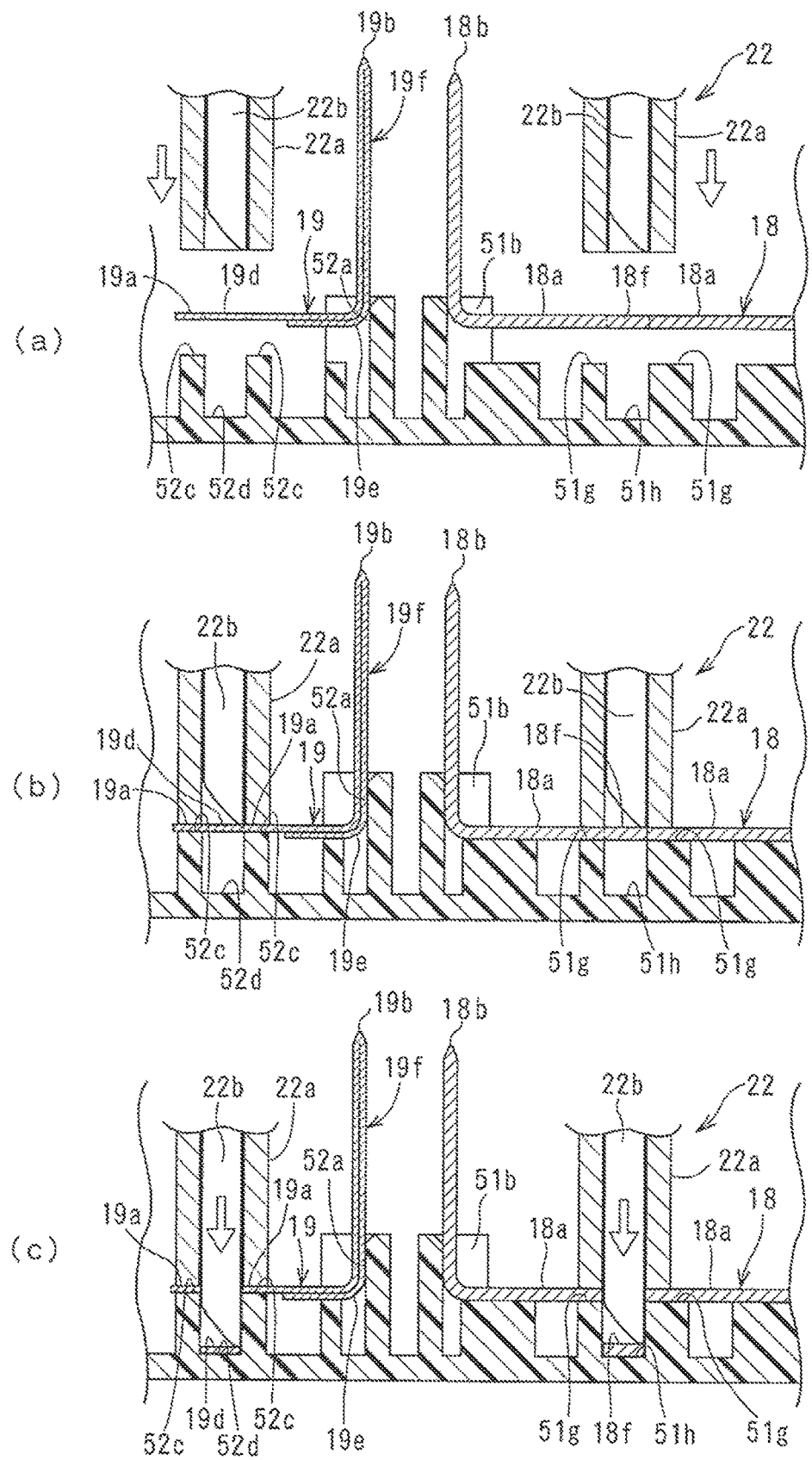

FIG. 12 are sectional views of the main part for illustrating assembling of the switch terminal module and the motor terminal to the housing. Part (a) of FIG. 12 illustrates a temporally assembling state of the switch terminal module and the motor terminal, part (b) of FIG. 12 illustrates a state in which an assembling device presses the switch terminal module and the motor terminal, and part (c) of FIG. 12 illustrates a state in which a coupling portion is cut off.

DESCRIPTION OF EMBODIMENTS

Figure 1:
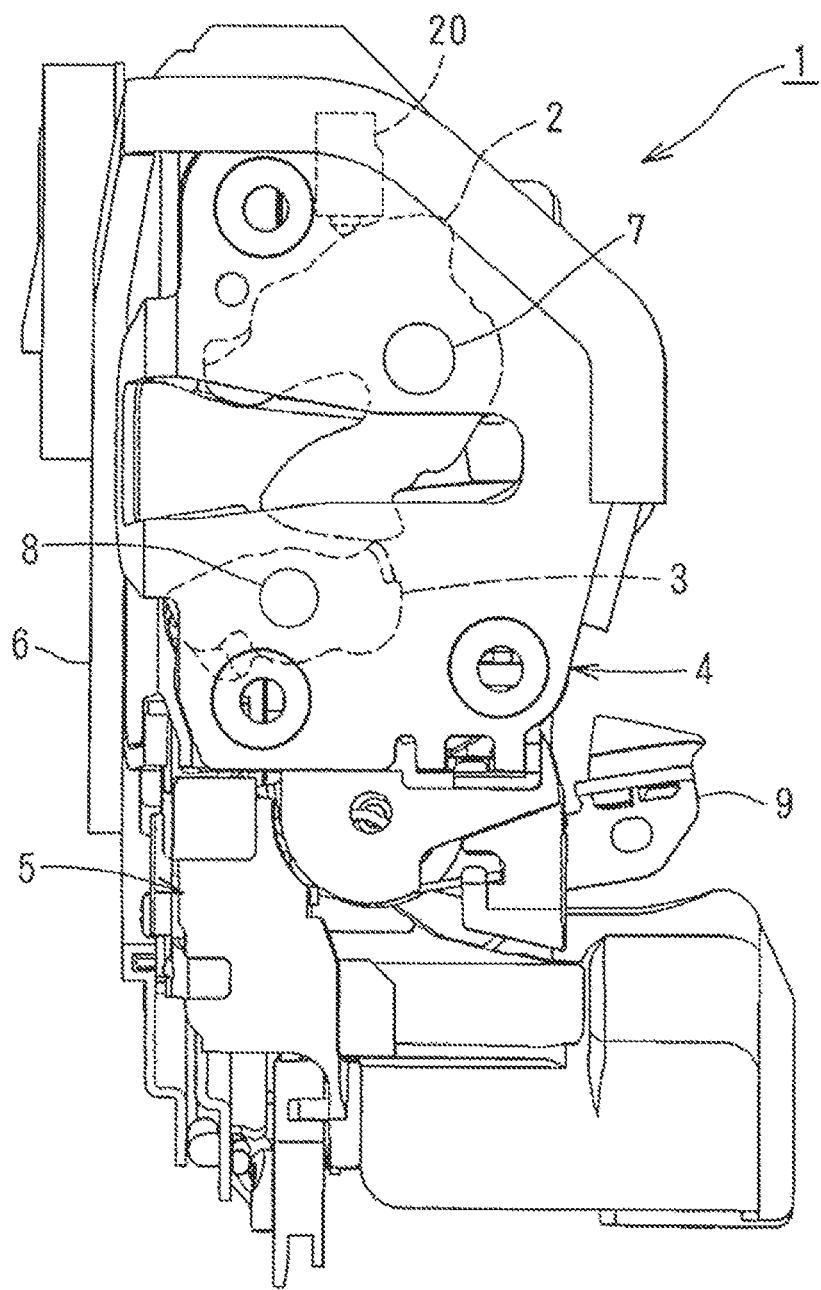
FIG. 1 is a front view of a vehicle door lock device according to the present invention.
Figure 2:
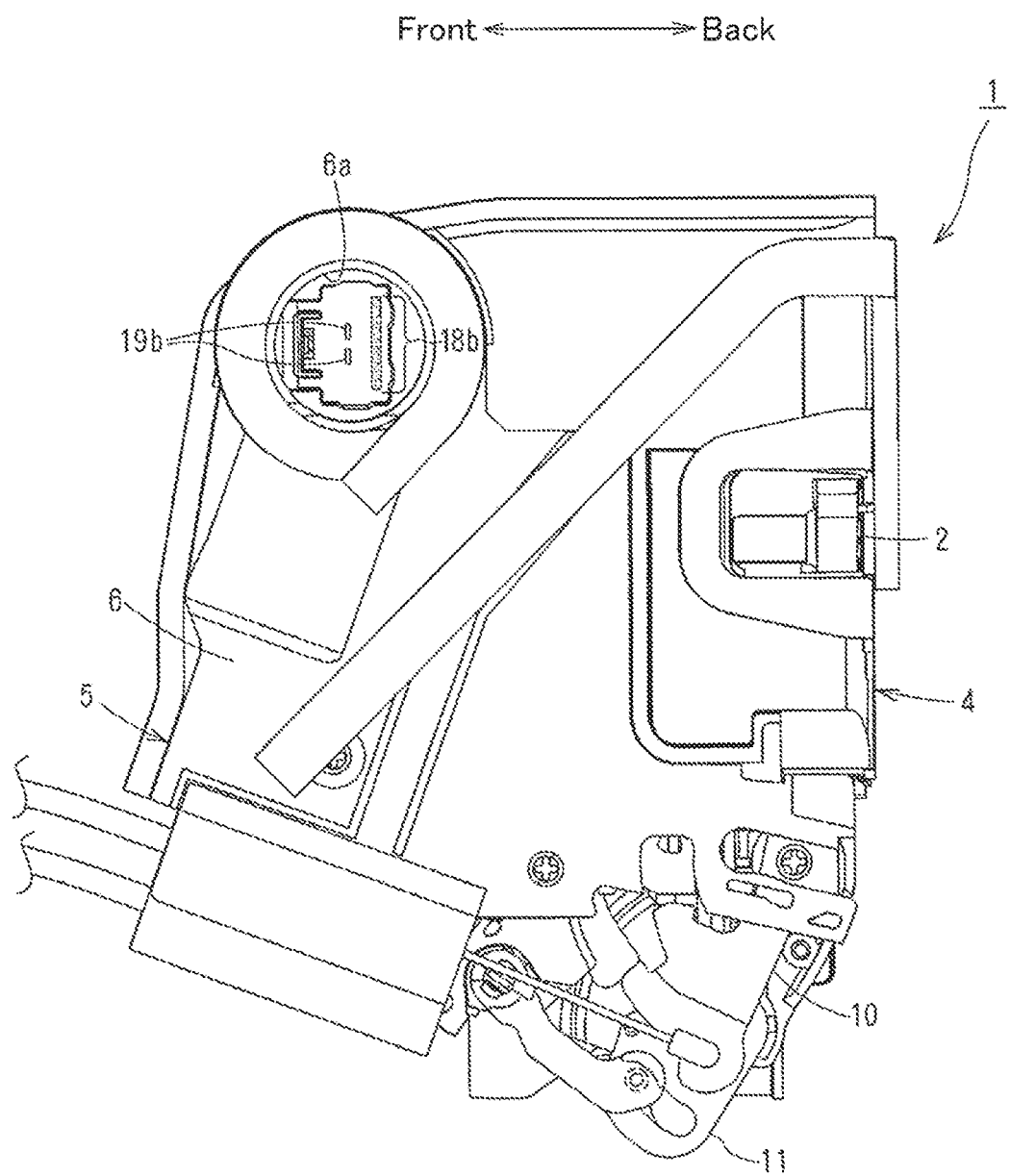
FIG. 2 is a side view of the vehicle door lock device.
Figure 3:
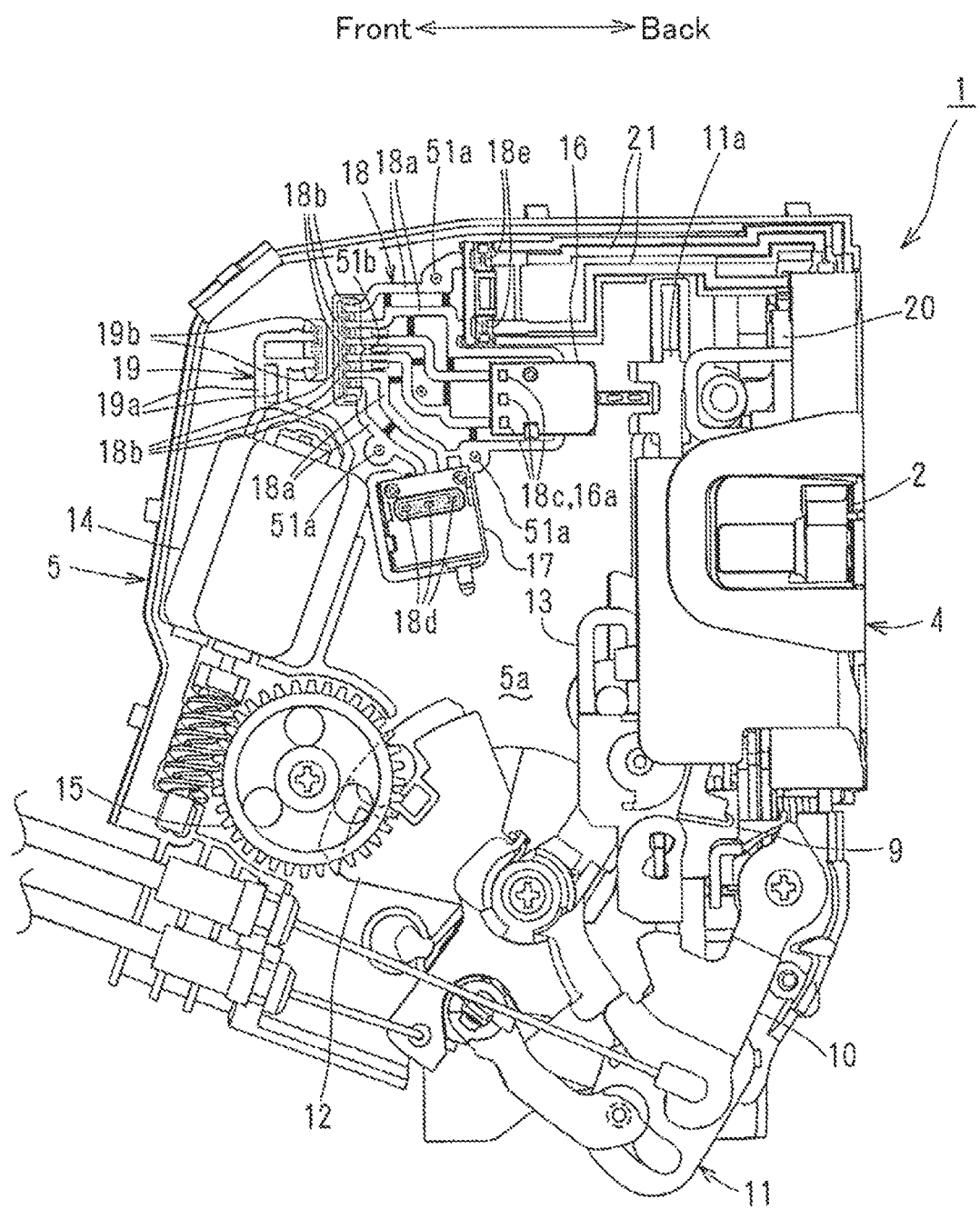
FIG. 3 is a side view illustrating an internal configuration of the vehicle door lock device.

Now, one embodiment according to the present invention is described with reference to the drawings. FIG. 1 is a front view of a vehicle door lock device 1 to which the present invention is applied, FIG. 2 is a side view of the vehicle door lock device 1, and FIG. 3 is a side view illustrating an internal configuration of the vehicle door lock device 1. Directions in the following description are indicated with a vehicle as a reference. The directions with the vehicle as a reference are indicated with the vertical arrows (up and down) and the outward arrows (out) (that is, outdoors) as appropriate in the drawings.

The vehicle door lock device 1 is fixed to an inner rear end of a front door on a driver's seat side of a vehicle (hereinafter, referred to as "door"), and includes a latching mechanism including a latch 2 and a ratchet 3 for maintain the door in a closed state, a body 4 in which a latch switch 20 for detecting a rotational position of the latch 2 is arranged, and a synthetic-resin housing 5 fixed on a front surface of the body 4, in which constituent elements described later are arranged. Note that, in order to clearly illustrate the constituent elements stored in the housing 5, FIG. 3 illustrates a mode from which a cover 6 that closes a side surface of the housing 5 and forms a part of the housing 5 is omitted.

As illustrated in FIG. 1, the latch 2 is pivotally supported by a latch shaft 7 in the body 4 and is meshed with a striker (not shown) on the vehicle side at the time of closing the door. The ratchet 3 is pivotally supported by a ratchet shaft 8 in the body 4 and is engaged with the latch 2 meshed with the striker, whereby the latch 2 is prevented from rotating and the door is maintained in the closed state. Furthermore, when the engagement with the latch 2 is released, the door can be opened.

As illustrated in FIG. 2, in a side surface of the cover 6, a connector insertion port 6a is formed, into which external connectors (not shown), that is electrically connected to an electric wireline connected to a battery (not shown) and an electronic control unit (ECU) (not shown) mounted on the vehicle, can be inserted. When the external connector is inserted into the connector insertion port 6a, terminals of the external connectors, and connector pins 18b of a switch terminal 18 and connector pins 19b of a motor terminal 19 described later that are arranged in the connector insertion port 6a are electrically connected to each other. Thus, the electric power of a battery can be fed to a motor 14 being an electrical component stored in the housing 5, and detection signals of a key switch 16, a lock switch 17, and the latch switch 20 being electrical components can be output to the ECU.

As illustrated in FIG. 3, in the housing 5, the following constituent elements are arranged, specifically, an outside lever 9 coupled to an outside handle (not shown) for an opening operation of the door, which is provided on a vehicle external side of the door, an inside lever 10 coupled to an inside handle for the opening operation of the door, which is provided on a vehicle internal side of the door, a key lever 11 coupled to a key cylinder (not shown) for a locking/unlocking operation, which is provided on the vehicle external side of the door, a subkey lever 11a that is vertically movable in association with an operation of the key lever 11, a locking mechanism (without a reference symbol), which is coupled to the key lever 11 and includes a lock lever 12 and a lift lever 13 for performing switching between a lock state for cancelling the door opening operation of the outside handle and an unlock state for enabling the door opening operation with a releasing operation of the ratchet 3, based on the door opening operation of the outside handle, the motor 14 for causing the locking mechanism to perform switch operations from the lock state to the unlock state and from the unlock state to the lock state with electromotive power, a worm wheel 15 for transmitting drive power of the motor 14 to the lock lever 12, the key switch 16 for detection an operation of the key lever 11 via the subkey lever 11a, the lock switch 17 being an electrical component for detection an operation of the lock lever 12, the switch terminal 18 formed of a conductive material for outputting the detection signals the key switch 16, the lock switch 17, and the latch switch 20 to the ECU, and the motor terminal 19 formed of a conductive material for feeding electric power of the battery to the motor 14.

Note that the latch 2, the ratchet 3, the outside lever 9, the inside lever 10, the key lever 11, the subkey lever 11a, the lock lever 12, the lift lever 13, and the worm wheel 15 have publicly known configurations and do not relate to the present invention directly. Thus, the detailed description thereof is omitted.

Figure 4:
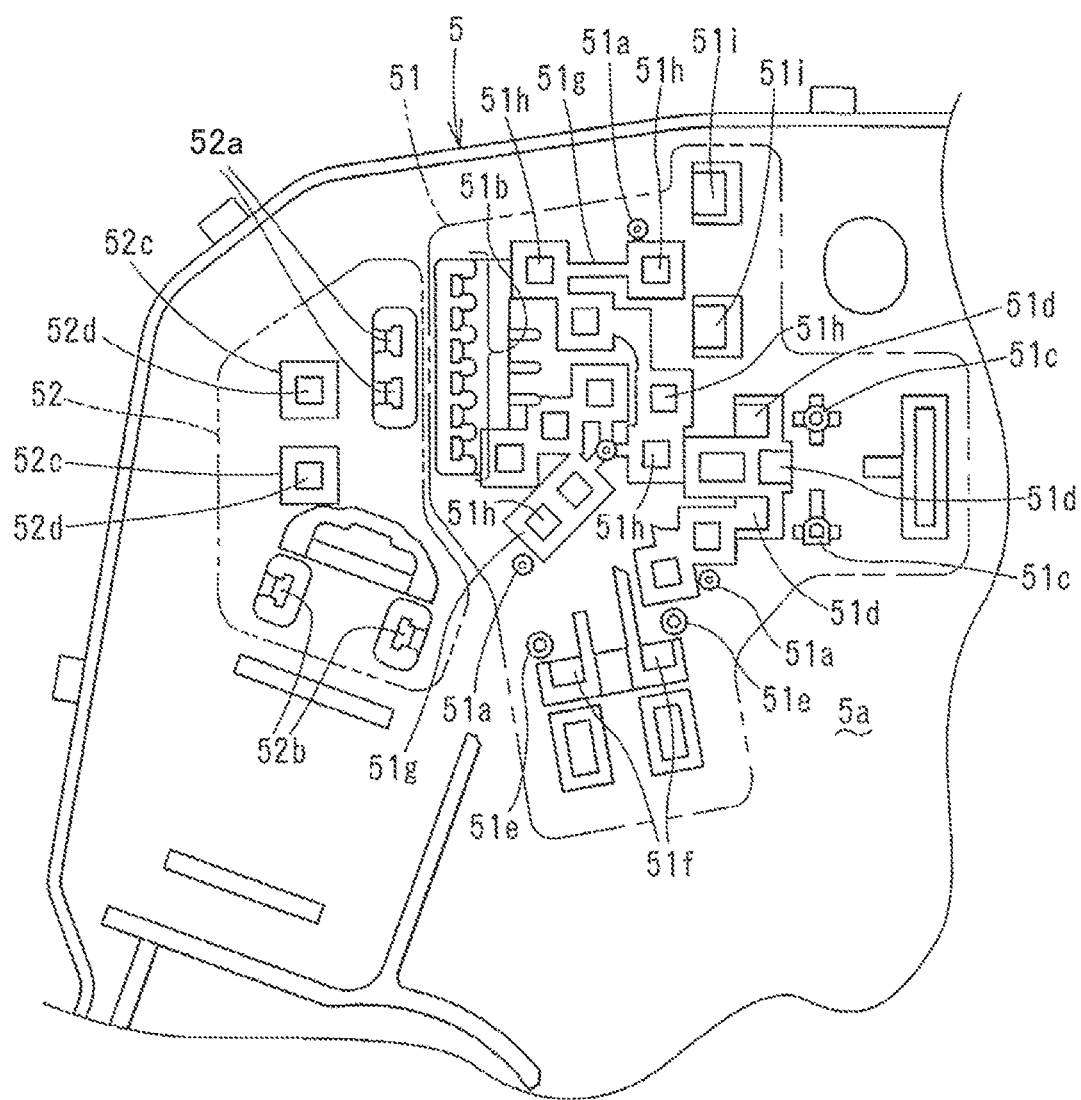
FIG. 4 is an enlarged side view of a main part of a housing.
Figure 5:
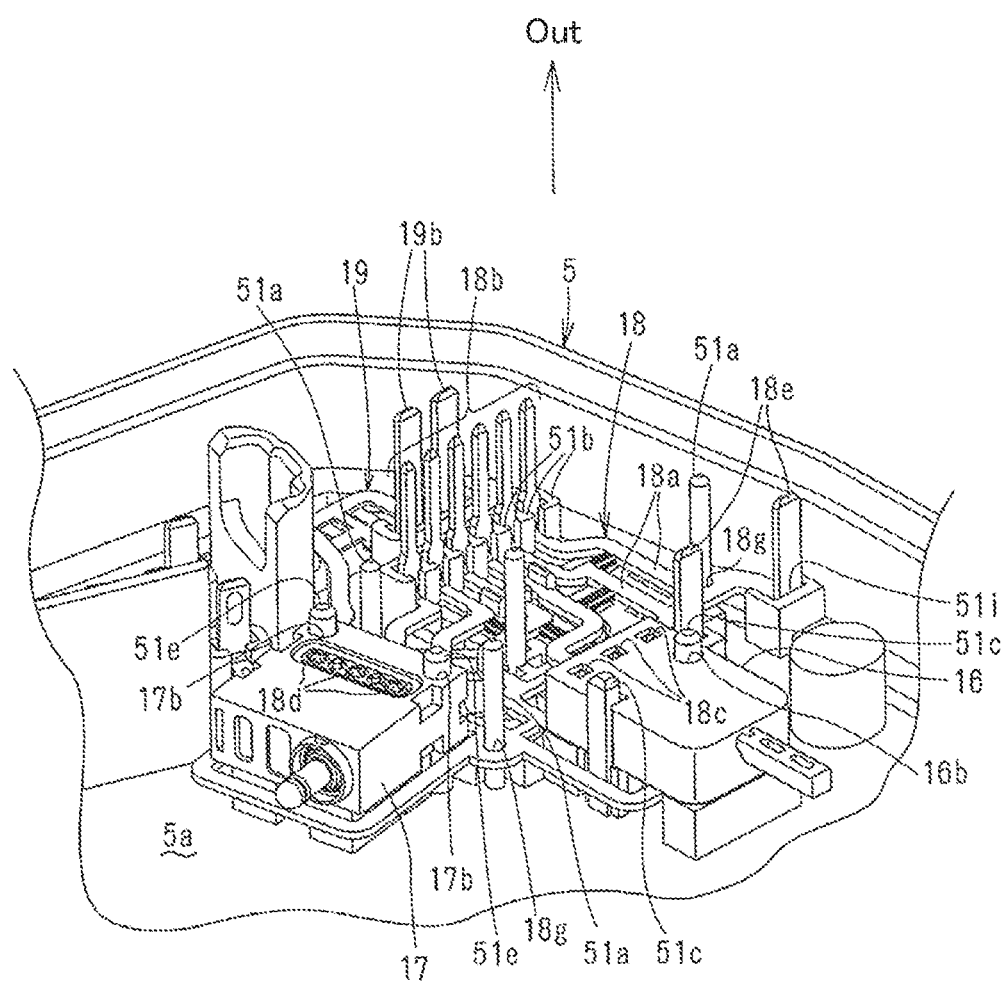
FIG. 5 is a perspective view of a main part in a state in which a switch terminal module and a motor terminal are assembled to the housing.

FIG. 4 is an enlarged side view of a main part of the housing 5 in a state in which the terminals 18 and 19 and the electrical components are not assembled. FIG. 5 is a perspective view of a main part in a state in which the terminals 18 and 19, and the switches 16 and 17 are assembled to the housing 5. FIG. 6 is a side view of a main part in a state in which the terminals 18 and 19 and the switches 16 and 17 are assembled to the housing 5.

As illustrated in 4, the housing 5 includes, as a main part, a first region part 51 in which the key switch 16, the lock switch 17, and the switch terminal 18 are arranged and a second region part 52 in which the motor terminal 19 is arranged.

In the first region part 51, the following portions are provided, specifically, a plurality of (three in the embodiment) positioning protruding portions 51a that protrude outward (to a front direction in FIG. 4) in a cylindrical shape at a right angle with respect to an arrangement surface 5a (surface on which the constituent elements are arranged) of the housing 5, a plurality of (six in the embodiment) connector fitting grooves 51b that are formed at positions corresponding to the position of the connector insertion port 6a and are opened outward in a substantially T shape, first protruding portions 51c protruding outward at a right angle and first recessed portions 51d opened outward in a region in which the key switch 16 is arranged, second protruding portions 51e protruding outward at a right angle and second recessed portions 51f opened outward in a region in which the lock switch 17 is arranged, installation portions 51g that protrude outward from the arrangement surface 5a by a predetermined amount in a shape corresponding to a pattern of an electric circuit of the switch terminal 18 and have surfaces parallel to the arrangement surface 5a, a plurality of punching recessed portions 51h provided in the installation portions 51g, and third recessed portions 51i opened outward.

To the second region part 52, the following portions are provided, specifically, a plurality of connector fitting grooves 52a opened outward in a substantially T shape at positions corresponding to the position of the connector insertion port 6a, recessed portions 52b opened outward in a region in which the motor 14 is arranged, installation portions 52c that protrude outward from the arrangement surface 5a by a predetermined amount in a shape corresponding to a pattern of an electric circuit of the motor terminal 19 and have surfaces parallel to the arrangement surface 5a, and a plurality of punching recessed portions 52d provided in the installation portions 52c.

Part (a) of FIG. 7 is a perspective view of a single switch terminal 18. Part (b) of FIG. 7 is a perspective view seen from a backside of a switch terminal module (a state in which the key switch 16 and the lock switch 17 are assembled to the switch terminal 18). Part (a) of FIG. 8 is an enlarged sectional view taken along the line A-A in FIG. 6. Part (b) of FIG. 8 is a sectional view corresponding to the line B-B in part (a) of FIG. 8. FIG. 9 is an enlarged sectional view taken along the line C-C in FIG. 6.

As illustrated in parts (a) and (b) of FIG. 7, the switch terminal 18 is formed of a conductive material being a conductive thin plate having a thickness of 0.6 mm, for example, and includes a plurality of conductive portions 18a forming electric circuits, the plurality of connector pins 18b to be electrically connected to the external connectors, a plurality of key switch ping 18c to be electrically connected to the key switch 16, a plurality of lock switch pins 18d to be electrically connected to the lock switch 17, latch switch pins 18e to be electrically connected to conductive terminals 21 (see FIG. 3) to be electrically connected to the latch switch 20, a plurality of coupling portions 18f that couple the conductive portions 18a adjacent to each other, and positioning holes 18g for positioning the switch terminal 18 by inserting the positioning protruding portions 51a of the housing 5. When the conductive portions 18a are disconnected by cutting off the coupling portions 18f, the electric circuits of the switches 16, 17, and 20 are formed.

The conductive portions 18a are portions that form electric circuits of the key switch 16, the lock switch 17, and the latch switch 20, and are arranged in the housing 5 under a state of being held in contact with the installation portions 51g as illustrated in FIG. 9.

the connector pins 18b are formed at one ends of the conductive portions 18a so as to be bent outward at a right angle with respect to the installation portions 51g, are fitted into the connector fitting grooves 51b in the first region part 51, and thus are fixed to the housing 5 so as to face an outside from the connector insertion port 6a. Preferably, as illustrated in part (a) of FIG. 8, widening portions 18h that are wide are formed on the connector pins 18b. Thus, under a state in which the connector pins 18b are fitted into the connector fitting grooves 51b, the widening portions 18h are press-fitted into the connector fitting grooves 51b, and hence the connector pins 18b can be fitted firmly into the connector fitting grooves 51b. As a result, assembling of the switch terminal 18 with respect to the housing 5 can be securely performed.

The key switch pins 18c are formed at the other ends of the conductive portions 18a so as to be bent outward at a right angle, are inserted into internal (female) pins 16a of the key switch 16 as illustrated in part (b) of FIG. 7 so as to be electrically connected to the key switch 16, and are fitted into the first recessed portions 51d in the first region part 51 as illustrated in FIG. 9 so as to be positioned with respect to the housing 5.

The lock switch pins 18d are formed at the other ends of the conductive portions 18a, which are parts different from the key switch pins 18c, so as to be bent outward at a right angle, are inserted into internal pins 17a of the lock switch 17 as illustrated in part (b) of FIG. 7 so as to be electrically connected to the lock switch 17, and are fitted into the second recessed portions 51f in the first region part 51 so as to be positioned with respect to the housing 5.

The latch switch pins 18e are formed at the other ends of the conductive portions 18a, which are parts different from the key switch pins 18c and the lock switch pins 18d, so as to be bent outward at a right angle, are electrically connected to the latch switch 20 via the terminals 21, and are fitted into the third recessed portions 51i in the first region part 51 so as to be positioned with respect to the housing 5.

The coupling portions 18f couple the conductive portions 18a adjacent to each other, and thus the plurality of conductive portions 18a can be assembled to the housing 5 at the same time. When the switch terminal module is assembled to the housing 5, a terminal cut device 22 described later performs cutting off, the conductive portions 18a adjacent to each other are disconnected from each other, and electric circuits of the key switch 16, the lock switch 17, and the latch switch 20 are formed.

The positioning holes 18g are provided in a part adjacent to the outermost conductive portions 18a among the plurality of conductive portions 18a, and the positioning protruding portions 51a of the housing 5 are inserted therein so as to position the switch terminal 18 with respect to the housing 5. As described above, the positioning holes 18g are provided in the part adjacent to the outermost conductive portions 18a, and therefore, when the terminal cut device 22 cuts off the coupling portions 18f, the positioning protruding portions 51a protruding from the positioning holes 18g do not interfere with an ascending/descending operation of the terminal cut device 22.

Note that FIG. 3, FIG. 5, and FIG. 6 illustrate the coupling portions 18f and 19d of the terminals 18 and 19 that are painted over. After assembling of the terminals 18 and 19 to the housing 5 is completed, the coupling portions 18f and 19d are cut off and do not exist.

As described above, the plurality of connector pins 18b are fitted into the plurality of connector fitting grooves 51b of the housing 5 under a press-fitting state, the plurality of positioning protruding portions 51a of the housing 5 are inserted into the plurality of positioning holes 18g, and further the key switch pins 18c, the lock switch pins 18d, and the latch switch pins 18e are fitted into the first recessed portions 51d, the second recessed portions 51f, and the third recessed portions 51i of the housing 5, respectively. In this manner, the switch terminal 18 is positioned at a regular position, and is assembled to the housing 5 securely. Particularly, the plurality of connector pins 18b electrically connected to the external connectors are press-fitted and fitted into the plurality of connector fitting grooves 51b, and hence can be fixed at regular positions securely, whereby electrical connection with the external connectors is securely established.

The key switch 16 includes the internal pins 16a and insertion holes 16b. The key switch pins 18c of the switch terminal 18 are inserted into the internal pins 16a, so that the key switch 16 is electrically connected to the switch terminal 18. The first protruding portions 51c in the first region part 51 of the housing 5 are inserted into the insertion holes 16b, so that the key switch 16 is positioned with respect to the housing 5.

The lock switch 17 includes the internal pins 17a and insertion holes 17b. The lock switch pins 18d of the switch terminal 18 are inserted into the internal pins 17a, so that the lock switch 17 is electrically connected to the switch terminal 18. The second protruding portions 51e in the first region part 51 of the housing 5 are inserted into the insertion holes 17b, so that the lock switch 17 is positioned with respect to the housing 5.

The motor terminal 19 is formed of a conductive material being a conductive thin plate having a thickness of 0.3 mm (a half of the plate thickness of the switch terminal 18), for example, and includes two conductive portions 19a, two connector pins 19b electrically connected to the external connectors, two motor pins 19c electrically connected to the motor 14, and two coupling portions 19d that couple the conductive portions 19a adjacent to each other. When the coupling portions 19d are cut off, the conductive portions 19a adjacent to each other are disconnected from each other, and an electric circuit of the motor 14 is formed.

The conductive portions 19a are parts forming the electric circuit of the motor 14 and are provided under a state of being held into contact with the installation portions 52c in the second region part 52.

The connector pins 19b are formed at one ends of the conductive portions 19a so as to be bent outward at a right angle, are inserted into the connector fitting grooves 52a in the second region part 52 of the housing 5, and thus are fixed to the housing 5 so as to face an outside from the connector insertion port 6a.

Preferably, as illustrated in FIG. 11, the connector pins 19b are formed in the following manner. That is, folding portions 19f are formed by being folded back at 180 degrees in the arrow α direction along the longitudinal direction so as to have a part obtained by overlapping two plates in thickness, and then the folding portions 19f are bent at a right angle in the arrow β direction. As illustrated in FIG. 9, the folding portions 19f are formed to include bending portion 19e being boundaries between the conductive portions 19a and the connector pins 19b. Thus, even when the thin plate having a thickness of 0.3 mm is adopted for the motor terminal 19, the thicknesses the connector pins 19b and the bending portions 19e can be set to the same thickness as the switch terminal 18, which is 0.6 mm, and hence the motor terminal 19 can be fixed securely to the connector fitting grooves 52a of the housing 5. As a result, the connector pins 19b are electrically connected securely to the external connectors together with the connector pins 18b of the switch terminal 18. Furthermore, the motor terminal 19 is formed of a thin material, and hence cost reduction can be achieved.

Next, with reference to FIG. 10 and FIG. 12, an assembling mode of the switch terminal 18 and the motor terminal 19 with respect to the housing 5 and a cutting-off mode of the coupling portions 18f and 19d are described.

First, as illustrated in FIG. 10, before assembling to the housing 5, in the switch terminal 18, the switch terminal module is obtained by electrically connecting the key switch 16 and the lock switch 17 to the switch terminal 18 in advance, to form the switch terminal module modularizing the key switch 16, the lock switch 17, and the switch terminal 18. The key switch 16 is electrically connected to the switch terminal 18 by inserting the key switch pins 18c of the switch terminal 18 into the internal pins 16a of the key switch 16. The lock switch 17 is electrically connected to the switch terminal 18 by inserting the lock switch pins 18d of the switch terminal 18 into the internal pins 17a of the lock switch 17.

Next, as illustrated in part (a) of FIG. 12, the switch terminal module is temporarily assembled to the first region part 51 of the housing 5. The temporal assembling is achieved by inserting the positioning protruding portions 51a of the housing 5 into the positioning holes 18g of the switch terminal 18 and slightly fitting the connector pins 18b of the switch terminal 18 into the connector fitting grooves 51b of the first region part 51. Furthermore, at the same time, the first protruding portions 51c of the housing 5 are inserted into the insertion holes 16b of the key switch 16, and the second protruding portions 51e of the housing 5 are inserted into the insertion holes 17b of the lock switch 17. Thus, the switch terminal module is temporarily assembled to the housing 5.

The connector pins 19b of the motor terminal 19 are slightly fitted into the connector fitting grooves 52a in the second region part 52.

Next, as illustrated in part (b) of FIG. 12, the switch terminal module and the motor terminal 19 that are temporarily assembled to the housing 5 pressed at regular assembling positions by the terminal cut device (assembling device) 22.

The terminal cut device 22 includes a plurality of cylindrical terminal clamps 22a that are movable vertically and includes punches 22b that are movable vertically in the terminal clamps 22a. In the switch terminal module, the terminal clamps 22a and the punches 22b are provided at positions corresponding to the coupling portions 18f of the switch terminal 18. In the motor terminal 19, the terminal clamps 22a and the punches 22b are provided at positions corresponding to the coupling portions 19d of the motor terminal 19.

Specifically, as understood from part (b) of FIG. 12 and part (c) of FIG. 12, in the switch terminal module, the terminal clamps 22a are provided in such manner that annular distal end surfaces thereof are held in contact with the surfaces of both the conductive portions 18a and 18a, which are coupled with each other by the coupling portions 18f, across the coupling portions 18f and that both the conductive portions 18a and 18a are pressed against the installation portions 51g. The punches 22b are provided at positions corresponding to the coupling portions 18f, and protrude from the distal ends of the terminal clamps 22a under a state in which the terminal clamps 22a press both the conductive portions 18a and 18a against the installation portions 51g. In this manner, the punches 22b are provided so as to cut off the coupling portions 18f.

In the motor terminal 19, the terminal clamps 22a are provided in such manner that the annular distal end surfaces are held in contact with the surfaces of both the conductive portions 19a and 19a, which are coupled with each other by the coupling portions 19d, across the coupling portions 19d and that both the conductive portions 19a and 19a are pressed against the installation portions 52c. The punches 22b are provided at positions corresponding to the coupling portions 19d, and protrude from the distal ends of the terminal clamps 22a under a state in which the terminal clamps 22a press both the conductive portions 19a and 19a against the installation portions 52c. In this manner, the punches 22b are provided so as to cut off the coupling portions 19d.

Under a state in which the switch terminal module is pressed by the terminal clamps 22a at the regular assembling positions, the positioning protruding portions 51a of the housing 5 are completely inserted into the positioning holes 18g of the switch terminal 18, the connector pins 18b of the switch terminal 18 are completely fitted into the connector fitting grooves 51b of the first region part 51, the conductive portions 18a are pressed against the installation portions 51g across the punching recessed portions 51h, the coupling portions 18f are positioned on the punching recessed portions 51h, the key switch pins 18c are fitted into the first recessed portions 51d, the lock switch pins 18d are fitted into the second recessed portions 51f, and the latch switch pins 18e are fitted into the third recessed portions 51i.

In the motor terminal 19, the connector pins 19b are completely fitted into the connector fitting grooves 52a in the second region part 52, the conductive portions 19a are pressed against the installation portions 52c in the second region part 52, the coupling portions 19d are positioned on the punching recessed portions 52d in the second region part 52, and the motor pins 19c are fitted into the recessed portions 52b in the second region part 52.

When the terminal cut device 22 further descends from the state illustrated in part (b) of FIG. 12, as illustrated in part (c) of FIG. 12, in the switch terminal module, the terminal clamps 22a press both the conductive portions 18a and 18a against the installation portions 51g, the punches 22b protrude from the distal ends of the terminal clamps 22a, and the punches 22b cut off the coupling portions 18f. Thus, the conductive portions 18a are disconnected, the electric circuits of the key switch 16, the lock switch 17, and the latch switch 20 are formed.

When the coupling portions 18f are disconnected, in the related art, there may a risk of the positional deviation of the switch terminal 18. However, in the present embodiment, such risk is avoided, and the coupling portions 18f can be cut off securely and accurately. This is because of the following reasons. That is, the distal end surfaces of the terminal clamps 22a press both the conductive portions 18a and 18a, which are coupled with each other by the coupling portions 18f, against the installation portions 51g across the coupling portions 18f, the positioning protruding portions 51a are inserted into the positioning holes 18g, and the connector pins 18b are fitted into the connector fitting grooves 51b.

Furthermore, in the motor terminal 19, both the conductive portions 19a and 19a, which are coupled with each other by the coupling portions 19d, are pressed against the installation portions 52c, the punches 22b protrude from the distal ends of the terminal clamps 22a, and the punches 22b cuts off the coupling portions 19d. Thus, the conductive portions 19a are cut off, and an electric circuit of the motor 14 is formed. In this case, when the coupling portions 19d are cut off, the plate thickness of the coupling portions 19d of the motor terminal 19 is 0.3 mm, which is thinner than that in the related art, and hence cutting off the coupling portions 19d can be performed easily.

After the motor terminal 19 is assembled to the housing 5, the motor 14 is electrically connected to the motor terminal 19 by inserting the motor pins 19c into internal pins (not shown) formed in a bottom surface of the housing.

The embodiment of the present invention is described above, and various modifications and changed as described below may be made to the present embodiment without departing from the gist of the present invention.

(a) In the above-mentioned embodiment, assembling work of the switch terminal module and the motor terminal 19 to the housing 5 is performed at the same time. Instead, assembling work may be performed separately.

(b) A technique for the folding portions 19f, which is applied to the connector pins 19b of the motor terminal 19, may be applied to any of the plurality of pins of the switch terminal 18.

(c) The coupling portions 18f are cut off by the punches 22b. Broken pieces may be press-fitted into the punching recessed portions 51h, and fixing may be performed in this state. Alternatively, the broken pieces may be removed by a removal method such as suction. Furthermore, the coupling portions 18f may cut off the two adjacent conductive portions 18a by cutting off, be bent, and remain connected to any one of the conductive portions 18a. That is, cutting off the coupling portions in this specification includes a case of generating broken pieces and a case of not generating broken pieces.

REFERENCE SIGNS LIST

1 Vehicle door lock device
2 Latch
3 Ratchet
4 Body
5 Housing
5a Arrangement surface
51 First region part
51a Positioning protruding portion
51b Connector fitting groove
51c First protruding portion
51d First recessed portion
51e Second protruding portion
51f Second recessed portion 51g Installation portion
51h Punching recessed portion
51i Third recessed portion
52 Second region part
52a Connector fitting groove
52b Recessed portion
52c Installation portion
52d Punching recessed portion
6 Cover
6a Connector insertion port
7 Larch shaft
8 Ratchet shaft
9 Outside lever
10 Inside lever
11 Key lever
11a Sub key lever
12 Lock lever
13 Lift lever
14 Motor (electrical component)
15 Worm wheel
16 Key switch (electrical component)
16a Internal pin
16b Insertion hole
17 Lock switch (electrical component)
17a Internal pin
17b Insertion hole
18 Switch terminal
18a Conductive portion
18b Connector pin
18c Key switch pin (electrical component pin)
18d Lock switch pin (electrical component pin)
18e Latch switch pin (electrical component pin)
18f Coupling portion
18g Positioning hole
18h Widening portion
19 Motor terminal
19a Conductive portion
19b Connector pin
19c Motor pin (electrical component pin)
19d Coupling portion
19e Bending portion
19f Folding portion
20 Latch switch
21 Terminal
22 Terminal cut device (assembling device)
22a Terminal clamp
22b Punch

The invention claimed is:

1. A vehicle door lock device, comprising:
a housing;
electrical components that are arranged in the housing and include internal pins; and
a terminal that is conductive and electrically connected to the internal pins of the electrical components, and includes coupling portions coupling conductive portions adjacent to each other, wherein
electric circuits of the electrical components are formed when the conductive portions are disconnected by cutting off the coupling portions,
the housing includes:
 positioning protruding portions that protrudes at a right angle with respect to installation portions on which the conductive portions of the terminal are installed; and
 fitting grooves that are opened in a direction parallel to a protruding direction of the positioning protruding portions, and
the terminal includes:
 the plurality of conductive portions;
 positioning holes into which the positioning protruding portions are inserted;
 connector pins that are formed at one ends of the conductive portions and bent at a right angle, and are fitted into the fitting grooves; and
 electrical component pins that are formed at other ends of the conductive portions and bent at a right angle, and are configured to be electrically connected to the electrical components when inserted into the internal pins of the electrical components.

2. The vehicle door lock device according to claim 1, wherein the positioning holes of the terminal are provided to outermost conductive portions among the plurality of conductive portions.

3. The vehicle door lock device according to claim 1, wherein the connector pins include widening portions that are press-fitted into the fitting grooves.

4. A method of manufacturing a vehicle door lock device, the vehicle door lock device including:
a housing;
switches that are arranged in the housing and include internal pins; and
switch terminal that is conductive and electrically connected to the internal pins of the switches, and includes coupling portions coupling conductive portions adjacent to each other;
electric circuits of the switches being formed when the conductive portions are disconnected by cutting off the coupling portions,
the housing including:
 positioning protruding portions that protrudes at a right angle with respect to installation portions on which the conductive portions of the switch terminal are installed; and
 fitting grooves that are opened in a direction parallel to a protruding direction of the positioning protruding portions,
the switch terminal including:
 the plurality of conductive portions;
 positioning holes into which the positioning protruding portions are inserted;
 connector pins that are formed at one ends of the conductive portions and bent at a right angle, and are fitted into the fitting grooves; and
 switch pins that are formed at other ends of the conductive portions and bent at a right angle, and are configured to be electrically connected to the switches when inserted into the internal pins of the switches,
the method of manufacturing a vehicle door lock device comprising:
fitting the positioning protruding portions into the positioning holes and fitting the connector pins into the fitting grooves under a state in which the switch pins are assembled to the switches in advance; and
pressing the conductive portions of the switch terminal against the installation portions by an assembling device, cutting off the coupling portions with punches of the assembling device, thereby allowing the conductive portions to form electric circuits of the switches.

5. The method of manufacturing a vehicle door lock device according to claim 4, wherein the assembling device cuts off the coupling portions with the punches under a state in which terminal clamps of the assembling device press both conductive portions adjacent to each other against the installation portions.

\* \* \* \* \*